US008253526B2

(12) United States Patent
Alexeyev

(10) Patent No.: US 8,253,526 B2
(45) Date of Patent: Aug. 28, 2012

(54) TERMINATION COMPENSATION FOR DIFFERENTIAL SIGNALS ON GLASS

(75) Inventor: Alexander A. Alexeyev, Gorham, ME (US)

(73) Assignee: Texas Instruments Incorporated, Dallas, TX (US)

(*) Notice: Subject to any disclaimer, the term of this patent is extended or adjusted under 35 U.S.C. 154(b) by 1314 days.

(21) Appl. No.: 11/778,312

(22) Filed: Jul. 16, 2007

(65) Prior Publication Data
US 2008/0278280 A1 Nov. 13, 2008

Related U.S. Application Data

(60) Provisional application No. 60/916,318, filed on May 7, 2007.

(51) Int. Cl.
*G08B 17/10* (2006.01)
*G05B 19/045* (2006.01)
*H01L 23/34* (2006.01)
*H04B 1/44* (2006.01)
*H03F 3/45* (2006.01)

(52) U.S. Cl. ...... 340/2.29; 340/634; 340/14.6; 257/723; 257/783; 455/78; 455/14; 330/253

(58) Field of Classification Search ................. None
See application file for complete search history.

(56) References Cited

U.S. PATENT DOCUMENTS

| 6,556,628 | B1 | 4/2003 | Poulton et al. | |
|---|---|---|---|---|
| 6,870,590 | B2* | 3/2005 | Shoji | 349/152 |
| 7,065,327 | B1* | 6/2006 | Macnally et al. | 455/78 |
| 7,173,449 | B2* | 2/2007 | Otsuka et al. | 326/30 |
| 7,499,676 | B2* | 3/2009 | Lee et al. | 455/78 |
| 7,499,677 | B2* | 3/2009 | Yu et al. | 455/78 |
| 7,764,935 | B2* | 7/2010 | Pallonen et al. | 455/115.1 |
| 2001/0052646 | A1* | 12/2001 | Effing et al. | 257/723 |
| 2003/0085758 | A1* | 5/2003 | Perner et al. | 330/9 |
| 2004/0130020 | A1* | 7/2004 | Kuwabara et al. | 257/723 |
| 2007/0099564 | A1* | 5/2007 | Dixit et al. | 455/14 |

FOREIGN PATENT DOCUMENTS

| JP | 2006-332276 A | 12/2006 |
|---|---|---|
| KR | 1998-053142 | 10/1998 |
| KR | 2002-0013736 | 2/2002 |
| KR | 0585359 | 6/2006 |
| KR | 0697281 | 3/2007 |

OTHER PUBLICATIONS

Non-Final Rejection corresponding to co-pending Korean Patent Application No. 10-2008-0041262, Korean Intellectual Property Office, dated Jan. 27, 2010, with English Translation, 13 pages.
German Search Report corresponding to co-pending German Patent Application No. 10 2008 022 087.6, German Patent Office, dated Jun. 15, 2009, 4 pages.
U.S. Appl. No. 11/753,163, entitled Stacked Differential Signal Transmission Circuitry, filed May 24, 2007, 28 pages.
Office Action from Japanese Patent Office for Appl. No. 2008-121579, 2 pages.

* cited by examiner

*Primary Examiner* — Jennifer Mehmood
*Assistant Examiner* — Fekadeselassie Girma
(74) *Attorney, Agent, or Firm* — Alan A. R. Cooper; Wade James Brady, III; Frederick J. Telecky, Jr.

(57) ABSTRACT

A system for calibrating operation of integrated differential signal receiver circuitry mounted on a substrate and coupled via surface conductors to edge mounted interface electrodes in which compensation is provided for variances among the resistances of the surface conductors.

7 Claims, 10 Drawing Sheets

TERMINATION COMPENSATION FOR DIFFERENTIAL SIGNALS ON GLASS

RELATED APPLICATIONS

This application claims priority from U.S. Provisional Patent Application No. 60/916,318, filed on May 7, 2007, the contents of which are incorporated herein by reference.

BACKGROUND

Differential signaling is widely employed in modern high-speed communication systems. Its main advantages are lower power consumption, higher noise immunity and lower electromagnetic interference (EMI) as compared with the traditional single ended technologies. Lower voltage swings and larger signal to noise ratios of differential interfaces also allow for higher achievable bandwidths, making them attractive for solutions that require serialization and deserialization of wide parallel busses, resulting in savings both in power and system costs. Differential transceivers can also be easily implemented in complementary metal oxide semiconductor (CMOS) integrated circuit (IC) manufacturing technology considered in this invention.

Traditionally, applications that utilize serial differential interfaces have been found in communication infrastructure, where large amounts of data are transmitted over long distances. Recently, proliferation of portable consumer electronics devices highlighted another potential application of serial differential interface technology that was usually served by single ended solutions. This application is display interface technology. High-resolution displays demand wide parallel interfaces for large number of pixel bits resulting in high costs, power dissipation and system integration difficulties. These problems are especially acute in mobile applications where space, system costs and power dissipation are especially important. In these applications serial differential display interface technology also provides other advantages, such as low EMI emissions and higher robustness against RF interference.

Although serial display interface technology has been known for some time, its use has generally been limited. In one example, separate serializer and deserializer devices convert parallel video data from an application or graphics processor into a serial data stream, which is then converted back into parallel form on the display module. Data is then sent to the display driver in a parallel manner. This architecture primarily addresses system integration problems associated with a large number of physical connections required to transmit high-resolution video data in parallel form. In another example, serial interfaces use different variants of single-ended physical layer technology.

From a system integration perspective a more preferable solution would be a differential serial interface where the serializer and deserializer are integrated within the application/graphics processor and the display driver respectively, thereby increasing power savings, cost efficiency and ease of use. However, while differential serial technology has worked well in communication systems, it has seen little use in display interface applications. At least one reason for this is based upon the properties of materials used for flat panel displays and specifically glass substrate based displays, such as liquid crystal displays (LCDs).

In one approach, the deserializer is integrated into the display driver. Current LCD manufacturing technology typically uses chip-on-glass (COG) based display drivers, which are integrated circuits that are surface-mounted via conductive bumps directly to the surface of the glass, resulting in display module that is compact and suitable for portable applications. In another approach, widely used with larger glass panels for which signals are brought to the edge of the glass, the display driver IC is connected to the glass via a separate add-on printed circuit board (PCB) that is attached to the glass via a special connector.

Referring to FIG. 1, there are two general types of differential signaling technologies: voltage mode and current mode. In both cases a set of switches controls the flow of signaling current from the transmitter through the termination resistor at the receiver and back to the transmitter. In current mode transmitters, signaling current is set with the help of two current sources: one for pull-up path and one for pull-down path. In voltage mode transmitters, signaling current is indirectly set via Ohms law as applied to the regulated supply voltage at the transmitter, driver output impedance and termination resistance RTR.

In either case, the receiver is a voltage mode high-speed comparator that distinguishes the sign of the differential voltage across the termination resistor RTR connected between the input pins DP, DM. The value of termination resistance is critical for correct operation of the interface. It is usually chosen to be equal to the characteristic differential impedance of the transmission lines that connect the receiver and transmitter to eliminate reflection at the receiver inputs. The resistor value also must be high enough to guarantee sufficient differential voltage at the input of the receiver. Hence, the optimal termination resistor value is usually chosen to be in the range of 80-125 ohms for systems using signal transmission media with single ended characteristic impedance Z0 of 50 ohms.

Signal transmission media in typical communication systems use materials with properties that allow construction of transmission lines (TL) for signal propagation. These materials usually have very low direct current (DC) or resistive losses and allow data to be sent over long distances with minimal loss of signal strength. Examples of such transmission media include copper traces on PCB substrates and coaxial cables. In systems on glass, such as LCD displays, transmission media have very different properties characterized primarily by higher DC resistance of the connections thereby making them appear more as discrete resistors rather than transmission lines.

Materials used in COG technology are ITO and ACF. Indium tin oxide (ITO) is a semi-translucent or translucent conducting film used by LCD manufacturers to produce electrical connections on the glass. Mechanical, chemical and thermal properties of ITO make it compatible with many standard IC manufacturing technologies like lithography and etch thereby allowing interconnects to be created with well controlled mechanical and electrical properties. Adhesive conductive film (ACF) is a conductive adhesive that is used to assist in bonding the IC to the ITO traces on the glass, is used as an intermediary step and has insignificant effects on the electrical properties of the chip-to-glass connection after the bonding procedure is completed.

Referring to FIG. 2, an example is shown of a system with an IC bonded to the glass with associated electrical connections on the glass from the IC to the glass edge connector.

Referring to FIG. 3, as noted above, ITO traces on the glass have significant DC resistance RP, e.g., in the range of 50-500 ohms/square, thereby increasing the effective termination resistance of the differential link if the receiver is placed on the glass, as would be the case with the COG display driver. A conventional differential receiver senses the differential voltage at its input pins, and the voltage across these pins will be significantly reduced due to the voltage divider effect produced by the series resistance of the ITO traces.

Referring to FIG. 4, a simple analysis of the equivalent electrical schematic of a conventional interconnect shows that such voltage reduction can be significant enough to reduce the signal-to-noise ratio (SNR) across the inputs DPTR, DMTR of the differential receiver such that performance of the serial interface will be degraded. Further, variability in the properties of ITO materials among manufacturers and under different environmental conditions will result in higher variances in the termination resistance thereby impeding or preventing interoperability between display modules and application/graphics processors from different vendors in different systems.

Referring to FIG. 5, a top level view is provided of a COG system with differential signaling technology to connect a differential transmitter on the PCB to the ICs bonded to the glass. Also depicted are associated parasitic resistances of the ITO traces on the glass. Such variability in termination resistance is incompatible with new industry standard specifications for low power chip-to-chip interconnects for mobile systems, such as those promoted by the Mobile Industry Processor Interface (MIPI) Alliance, where the resistance of the traces on the glass is limited to five ohms. Consequently, a problem to be solved can be summarized as follows: high DC resistances of on-glass interconnects and their manufacturing variability makes standards for on-chip termination of differential signals impractical in COG applications. A solution would address both of these deficiencies without sacrificing advantages of either differential signaling or COG technologies.

SUMMARY

In accordance with the presently claimed invention, a solution to problems discussed above employs resistance of the ITO traces on the glass as an integral part of the termination resistor of a differential interface. A system is provided for calibrating operation of integrated differential signal receiver circuitry mounted on a substrate and coupled via surface conductors to edge mounted interface electrodes in which compensation is provided for variances among the resistances of the surface conductors.

In accordance with one embodiment of the presently claimed invention, a substrate with interface electrodes and integrated differential signal receiver circuitry mutually coupled via a plurality of conductors includes a substrate, electrodes, conductors and integrated differential signal receiver circuitry. First and second interface electrodes are disposed on the substrate to convey a differential signal having a signal voltage and a signal current. First and second conductors are disposed on the substrate and coupled to the first and second interface electrodes to conduct the signal current, and third and fourth conductors are disposed on the substrate and coupled to the first and second interface electrodes to convey the signal voltage. The integrated differential signal receiver circuitry is coupled to the first, second, third and fourth conductors and includes: resistive circuitry to conduct the signal current, wherein the signal voltage has a magnitude related to the conduction of the signal current by the first and second conductors and the resistive circuitry; and amplifier circuitry to sense the signal voltage and in response thereto provide a corresponding output signal.

In accordance with another embodiment of the presently claimed invention, a substrate with interface electrodes and integrated resistance calibration circuitry mutually coupled via a plurality of conductors includes a substrate, electrodes, conductors and integrated calibration circuitry. First and second interface electrodes are disposed on the substrate to convey a calibration current and a related calibration voltage. First and second conductors are disposed on the substrate and coupled to the first and second interface electrodes to conduct the calibration current, third and fourth conductors are disposed on the substrate and coupled to the first and second interface electrodes to convey the calibration voltage, and a fifth conductor is disposed on the substrate and to be coupled to one of the first and second interface electrodes and conduct the calibration current. The integrated calibration circuitry is coupled to the first, second, third, fourth and fifth conductors and includes: current source circuitry to provide the calibration current; resistive circuitry to conduct the calibration current and including a resistance having a magnitude related to one or more control signals, wherein the calibration voltage has a magnitude related to the conduction of the calibration current by the first and second conductors and the resistive circuitry resistance; and control circuitry coupled to the resistive circuitry to sense the calibration voltage and in response thereto provide the one or more control signals.

In accordance with still another embodiment of the presently claimed invention, a substrate with interface electrodes and integrated calibration and differential signal receiver circuitry mutually coupled via a plurality of conductors includes a substrate, electrodes, conductors and integrated calibration and differential signal receiver circuitry. First and second calibration electrodes are disposed on the substrate to convey a calibration current and a related calibration voltage. First and second calibration conductors are disposed on the substrate and coupled to the first and second interface electrodes to conduct the calibration current, third and fourth calibration conductors are disposed on the substrate and coupled to the first and second calibration electrodes to convey the calibration voltage, and a fifth calibration conductor is disposed on the substrate and to be coupled to one of the first and second calibration electrodes and conduct the calibration current. First and second signal electrodes are disposed on the substrate to convey a differential signal having a signal voltage and a signal current. First and second signal conductors are disposed on the substrate and coupled to the first and second signal electrodes to conduct the signal current, and third and fourth signal conductors are disposed on the substrate and coupled to the first and second signal electrodes to convey the signal voltage. The integrated calibration and differential signal receiver circuitry is coupled to the first, second, third, fourth and fifth calibration conductors and the first, second, third and fourth signal conductors, and includes: current source circuitry to provide the calibration current; first resistive circuitry to conduct the calibration current and including a resistance having a magnitude related to one or more control signals, wherein the calibration voltage has a magnitude related to the conduction of the calibration current by the first and second calibration conductors and the first resistive circuitry resistance; control circuitry coupled to the first resistive circuitry to sense the calibration voltage and in response thereto provide the one or more control signals; second resistive circuitry to conduct the signal current and including a resistance having a magnitude related to at least one of the one or more control signals, wherein the signal voltage has a magnitude related to the conduction of the signal current by the first and second signal conductors and the second resistive circuitry; and amplifier circuitry to sense the signal voltage and in response thereto provide a corresponding output signal.

DETAILED DESCRIPTION

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together (e.g., as one or more integrated circuit chips) to provide the described function. Additionally, the term "signal" may refer to one or more currents, one or more voltages, or a data signal. Within the drawings, like or related elements will have like or related alpha, numeric or alphanumeric designators. Further, while the present invention has been discussed in the context of implementations using discrete electronic circuitry (preferably in the form of one or more integrated circuit chips), the functions of any part of such circuitry may alternatively be implemented using one or more appropriately programmed processors, depending upon the signal frequencies or data rates to be processed.

Figure 1:
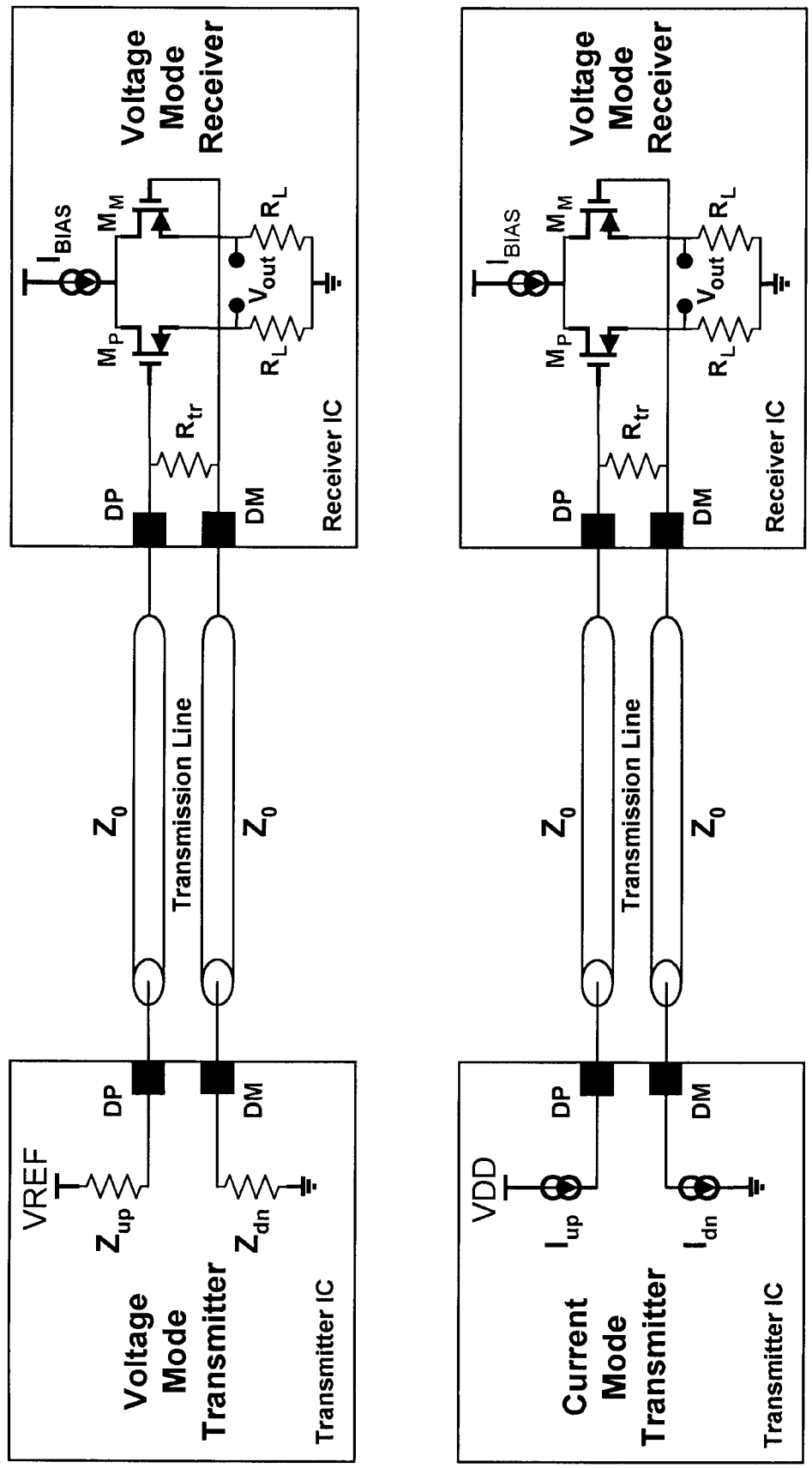
FIG. 1 illustrates basic circuit architectures for voltage mode and current mode differential signal links.
Figure 2:
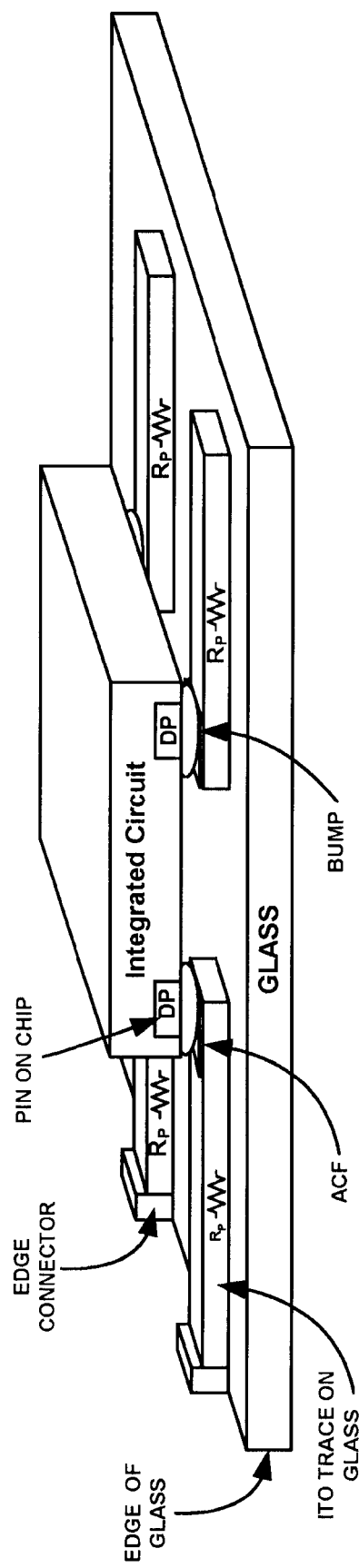
FIG. 2 illustrates a typical example of bonding an integrated circuit to a glass substrate, also known as "chip-on-glass" (COG).
Figure 3:
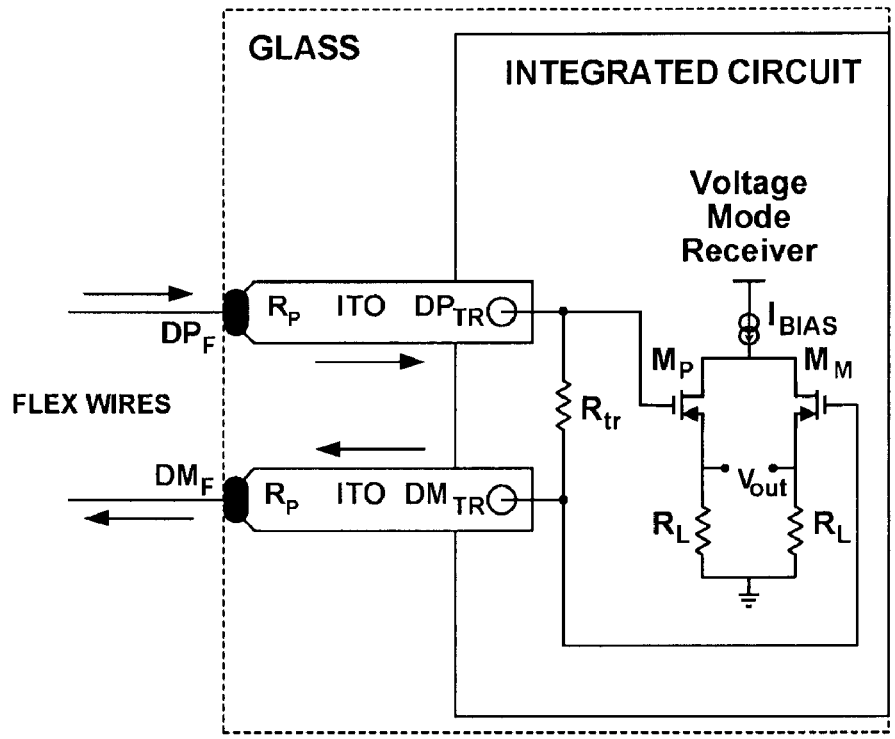
FIG. 3 illustrates a conventional differential signal connection for a COG receiver.
Figure 4:
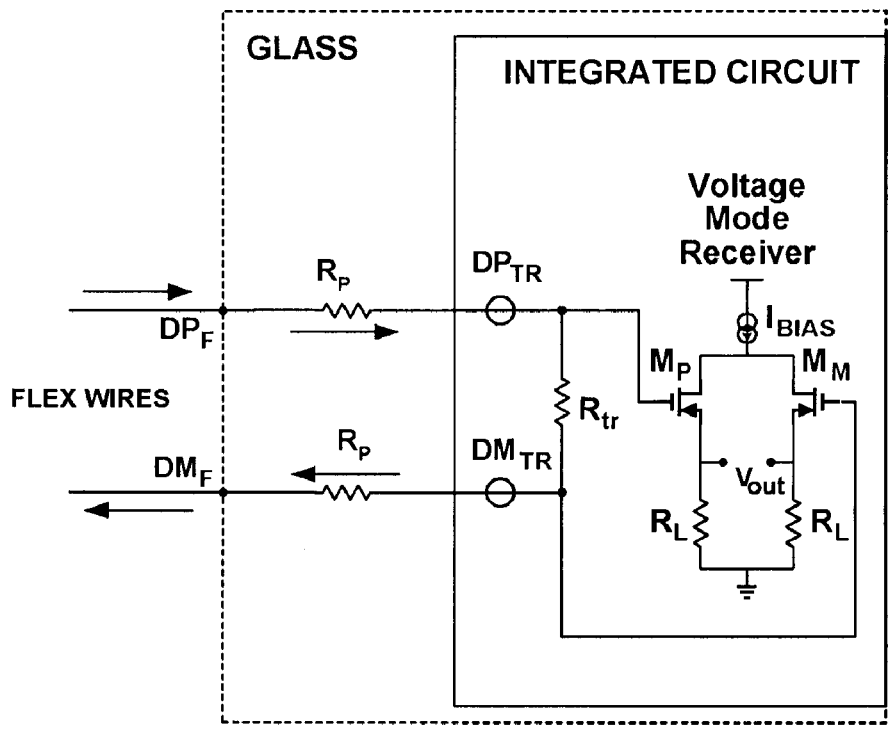
FIG. 4 illustrates an equivalent circuit for the differential signal connection of FIG. 4.
Figure 5:
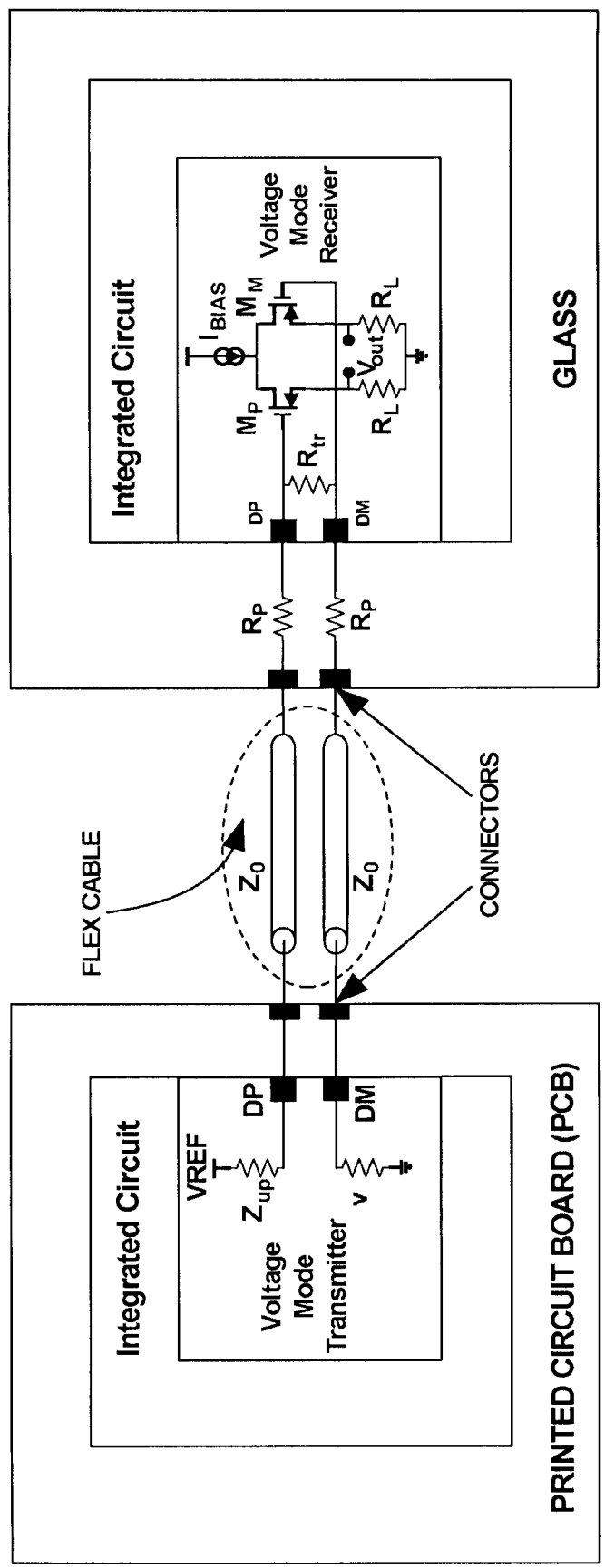
FIG. 5 illustrates a system with printed circuit board (PCB) and COG circuit modules.
Figure 6:
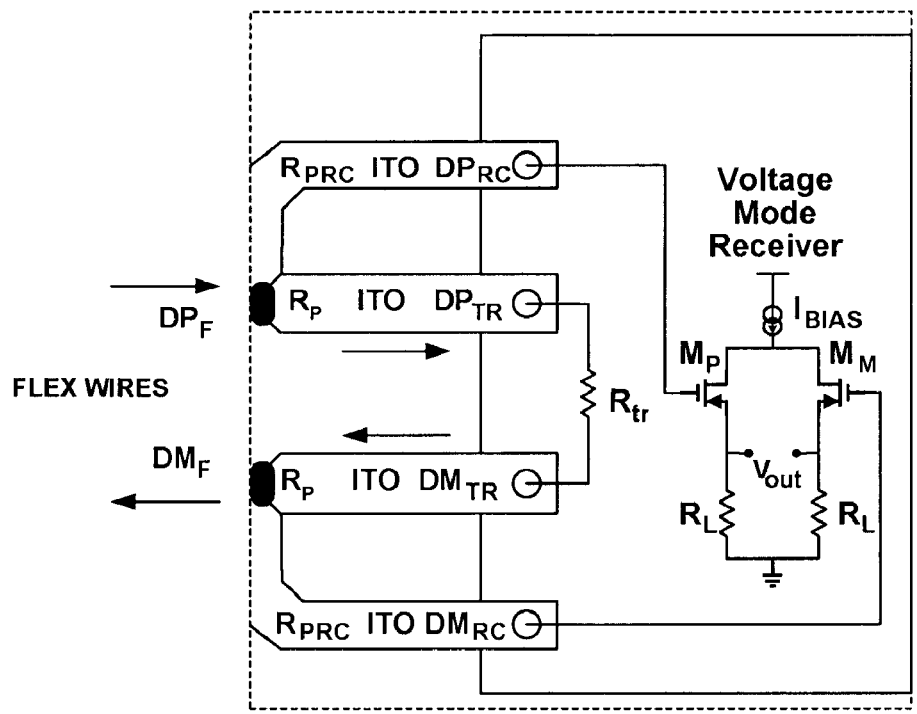
FIG. 6 illustrates a differential signal connection for a COG receiver in accordance with one embodiment of the presently claimed invention.

Referring to FIG. 6, the topology of the ITO interconnect between the glass edge and display driver IC includes a differential receiver IC with two additional electrodes, or pins, per differential link as compared to a conventional implementation one pair $DP_{TR}$, $DM_{TR}$ is used to connect the glass edge to the termination resistor, and the other pair $DP_{RC}$, $DM_{RC}$ is used to sense the differential voltage at the glass edge rather than at the receiver pins, i.e., the receiver sensing devices and termination resistor share input/output (I/O) electrodes on the IC.

Figure 7:
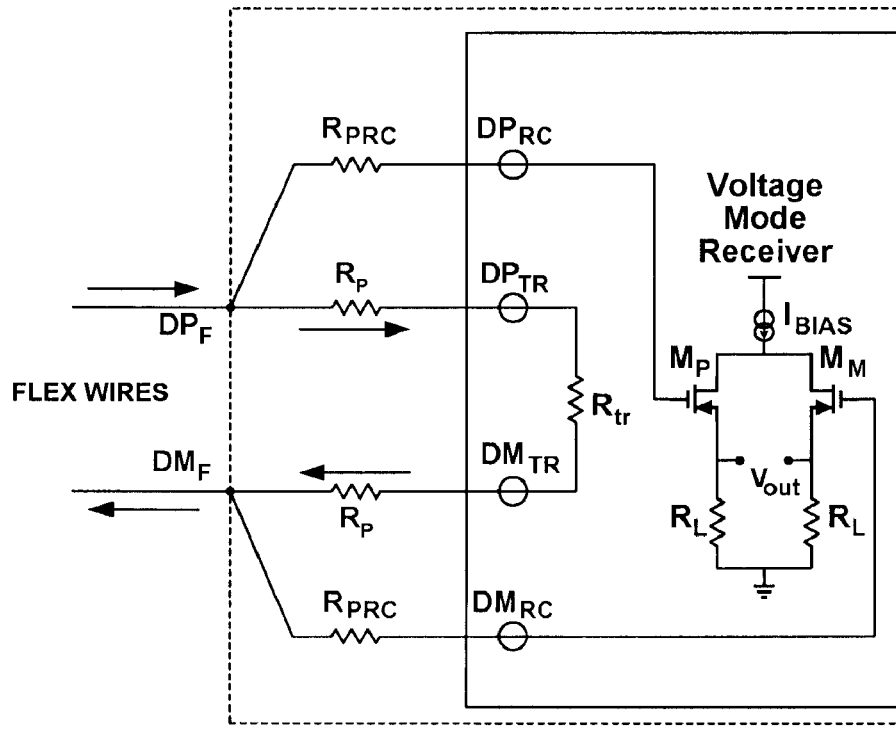
FIG. 7 illustrates an equivalent circuit for the differential signal connection of FIG. 6.

Referring to FIG. 7, an equivalent circuit diagram is shown for the topology of the circuitry of FIG. 6. As is well known, in CMOS technology the receiver sensing devices will be either P-type or N-type field effect transistors (P-MOSFETs or N-MOSFETs), or a combination thereof. The input impedance of a MOSFET at its gate terminal is extremely high. Hence, the voltage drop across the ITO traces between the glass edge and the sensing devices, i.e., between $DP_F$ and $DP_{RC}$ and between $DM_F$ and $DM_{RC}$, is very low and can effectively be neglected.

The ITO traces between the glass edge and termination resistors should have resistances that do not exceed half of the targeted differential termination resistance for the link minus a predetermined minimum on-die termination resistance as discussed below. Specific values of these resistances should be determined based on the particular application requirements and properties of materials to be used. Suggested ratios can be approximately 45% of the required differential termination for each of the ITO traces and 10% for the on-die termination. For example, for a targeted total termination resistance $R_{TR}+2*R_P$, nominal values should be 45 ohms for resistance $R_P$ and 10 ohms for resistance $R_{TR}$. In the event that the resistances of the ITO traces closely approach or are substantially equal to half of the targeted differential termination resistance for the link, the on-die termination resistance can be implemented as a very low resistance circuit (e.g., one or more MOSFETs operated in a resistive mode of operation) or as a virtually zero resistance circuit ($R_{TR}=0$, e.g., in the form of a selected length of conductor formed as part of a metalization layer of the die).

Preferably, the channels of the differential interface should have substantially similar topologies, dimensions and physical properties for the ITO interconnects between the glass edge and display driver IC. This will allow similar control stimuli to be applied to all channels during compensation thereby avoiding the need to compensate each channel separately.

Figure 8:
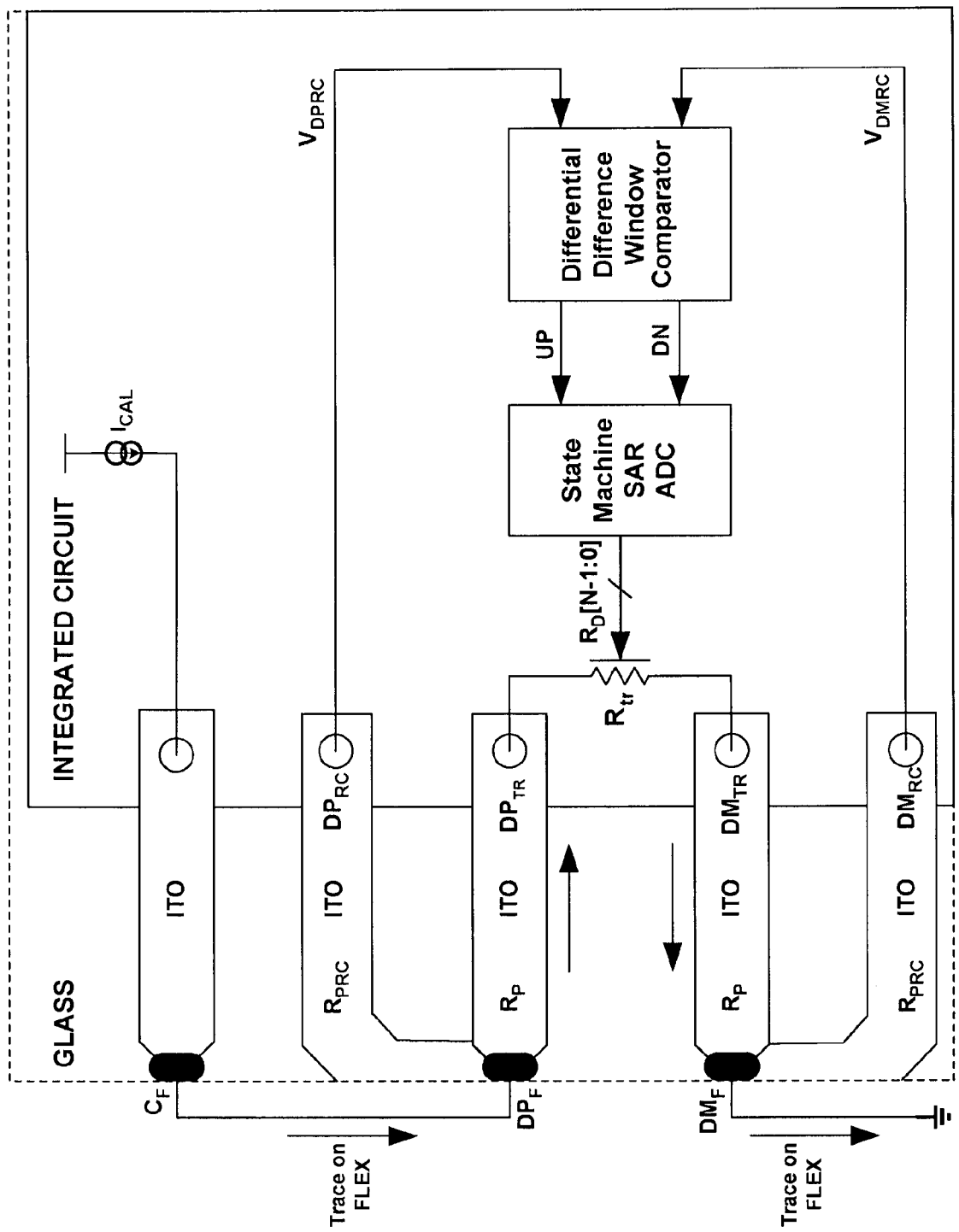
FIG. 8 illustrates a circuit schematic for a differential difference window comparator suitable for use with termination compensation circuitry in accordance with another embodiment of the presently claimed invention.
Figure 9:
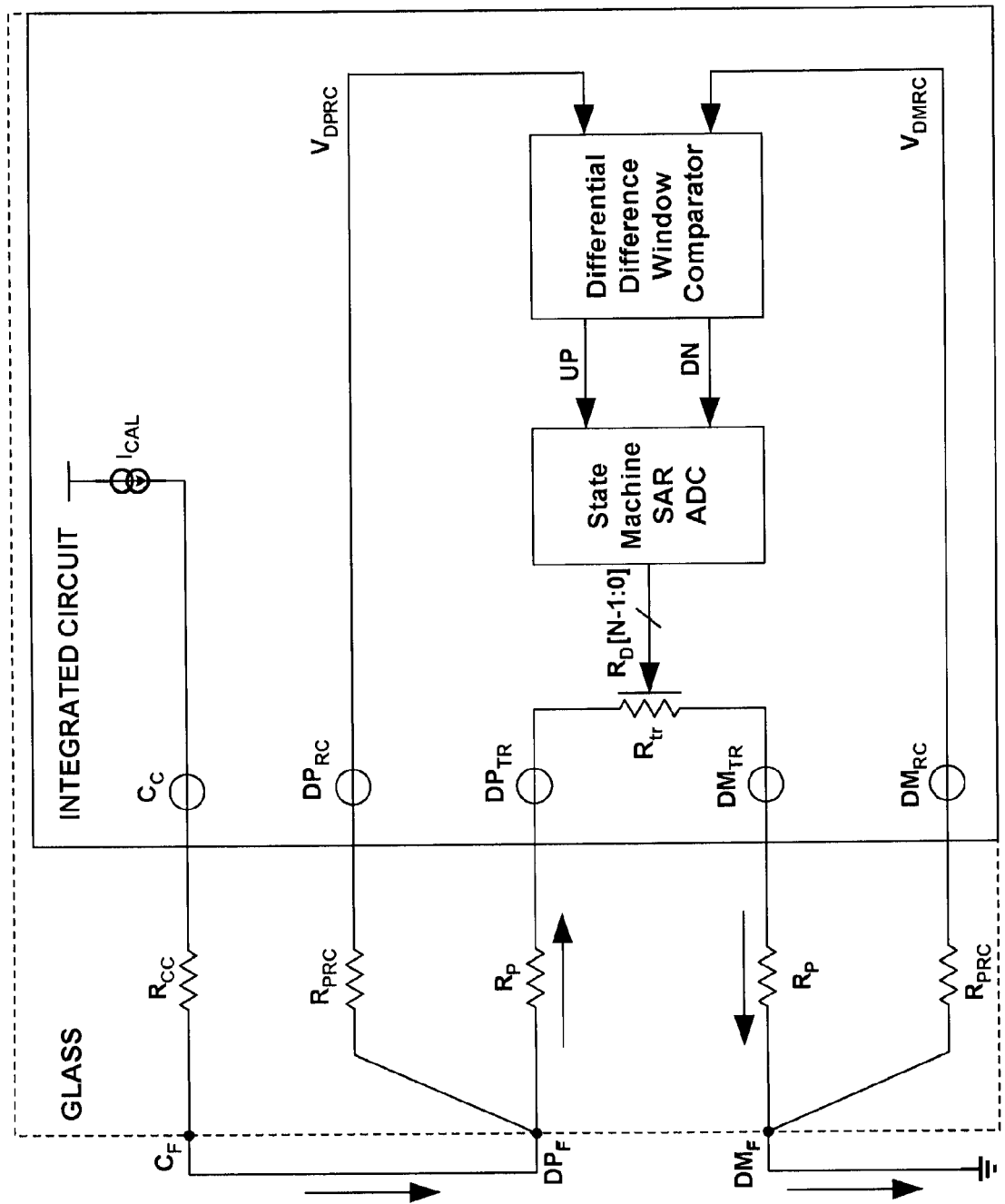
FIG. 9 illustrates a differential signal connection with termination compensation circuitry for a COG receiver in accordance with another embodiment of the presently claimed invention.

Referring to FIGS. 8 and 9, replica ITO interconnect and on-die sensing and termination resistance compensation circuitry and equivalent electrical circuitry, respectively, are shown in accordance with the presently claimed invention. As shown, a replica of the ITO interconnect between the glass edge and differential receiver is used to indirectly measure resistance of the ITO traces between the glass edge and termination resistor. This replica interface should have the same topology, dimensions and physical properties as the interconnects for the differential channels. As shown, the display driver IC has five additional pins to connect the replica interface to the internal termination resistance compensation circuitry. The compensation circuitry includes a current source $I_{CAL}$ that provides a precision reference current to the replica interface via electrodes $C_F$, $DP_F$ and $DM_F$. a differential voltage $V_{DPRC}-V_{DMRC}$ proportional to the sum of the resistance of ITO traces and the on die termination resistor appears across the first differential pair input electrodes $DP_{RC}$, $DM_{RC}$ of the differential difference window comparator. The differential difference window comparator provides control signals UP, DN to a state machine with analog-to-digital conversion (ADC) circuitry to provide an N-bit word, or signal, for controlling on-die termination resistances $R_{tr}$ of the compensation circuitry and the data signal receiver circuits.

Figure 10:
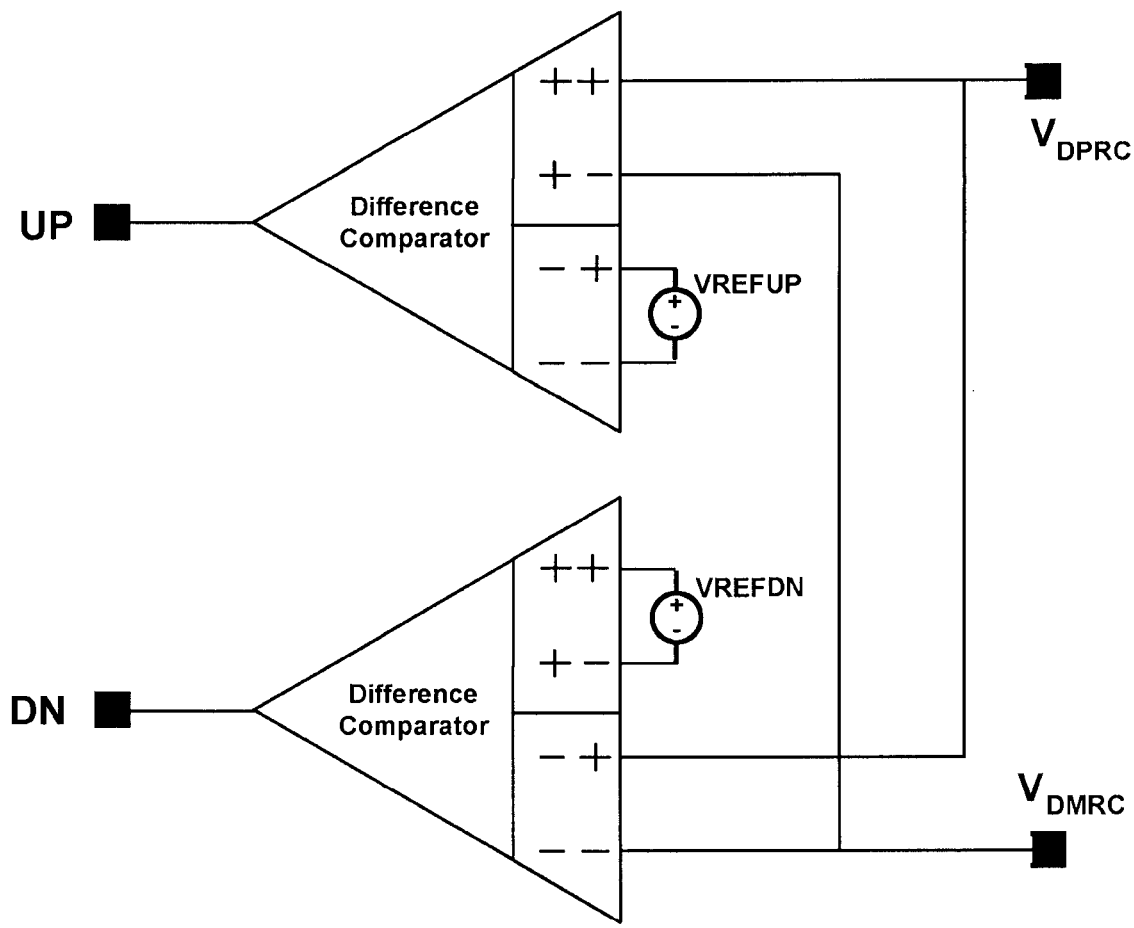
FIG. 10 illustrates an equivalent circuit for the differential signal connection with termination compensation circuitry of FIG. 9.

Referring to FIG. 10, a first reference voltage $V_{REFUP} = I_{CAL}*(R_{TRTARG}-R_{TOL})$ is appears at the first reference input of the differential difference window comparator and a second reference voltage $V_{REFDN} = I_{CAL}*(R_{TRTARG}+R_{TOL})$ appears at a second reference input of differential difference window comparator as shown. (Resistance $R_{TRTARG}$ is the targeted termination resistance value of the differential interface, and $R_{TOL}$ is the tolerance to which the compensation is intended to control this termination resistance.) The differential difference window comparator compares the measured differential voltage $V_{DPRC}-V_{DMRC}$ to the reference voltages $V_{REFUP}$, $V_{REFDN}$ to determines if it is within a desired tolerance window.

If the measured voltage is within the desired tolerance window then no corrective action is required. If the measured voltage is outside the window then corrective action is required. Corrective action is signaled by asserting signal UP if the termination resistance $R_{tr}$ must be increased and asserting signal DN if it must be decreased, and is applied to the on-die termination resistance $R_{tr}$ by either increasing or decreasing the termination resistance $R_{tr}$ value to bring the combined resistance value within the tolerance window.

The differential difference window comparator compares the differential voltage at the glass edge electrodes $DP_F$, $DM_F$ to the reference voltages. Hence, the voltage drop across any segment of the path for the reference current $I_{CAL}$ not used in generating the sensed differential voltage $V_{DPRC}-V_{DMRC}$ is not used for calibration, thereby allowing for flexibility in routing of these signals on the glass and outside.

Figure 11:
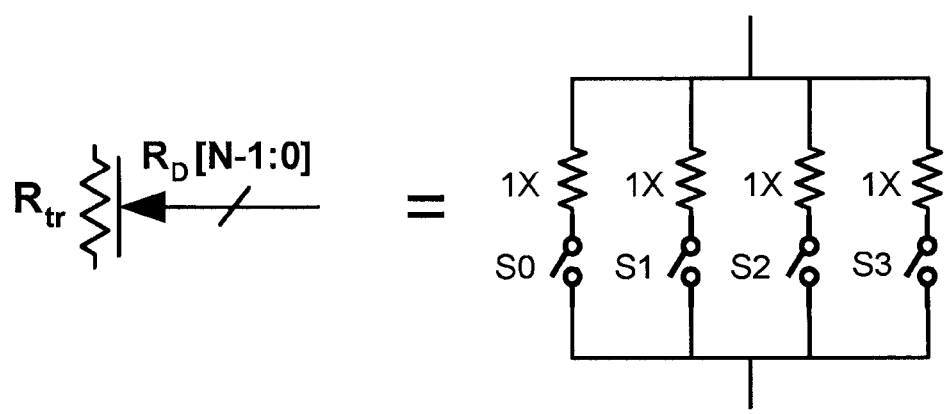
FIG. 11 illustrates an example of providing digital control as part of the termination compensation circuitry of FIG. 9.

Referring to FIG. 11, the on-die termination resistance can be controlled in either a digital or analog manner as desired. A digitally controlled compensation resistance can be realized via a set of resistors controlled by switches as shown. In this case, the combined resistance of this resistor bank is binary encoded by either appropriately choosing resistor values or the correct encoding for digital control signals to guarantee monotonic control of the termination resistance. An analog controlled resistance can be adjusted by varying a gate voltage of a MOSFET that is used as a voltage controlled resistor in accordance with well known techniques. Digital control may often be preferred because of its better noise immunity and overall robustness.

Figure 12:
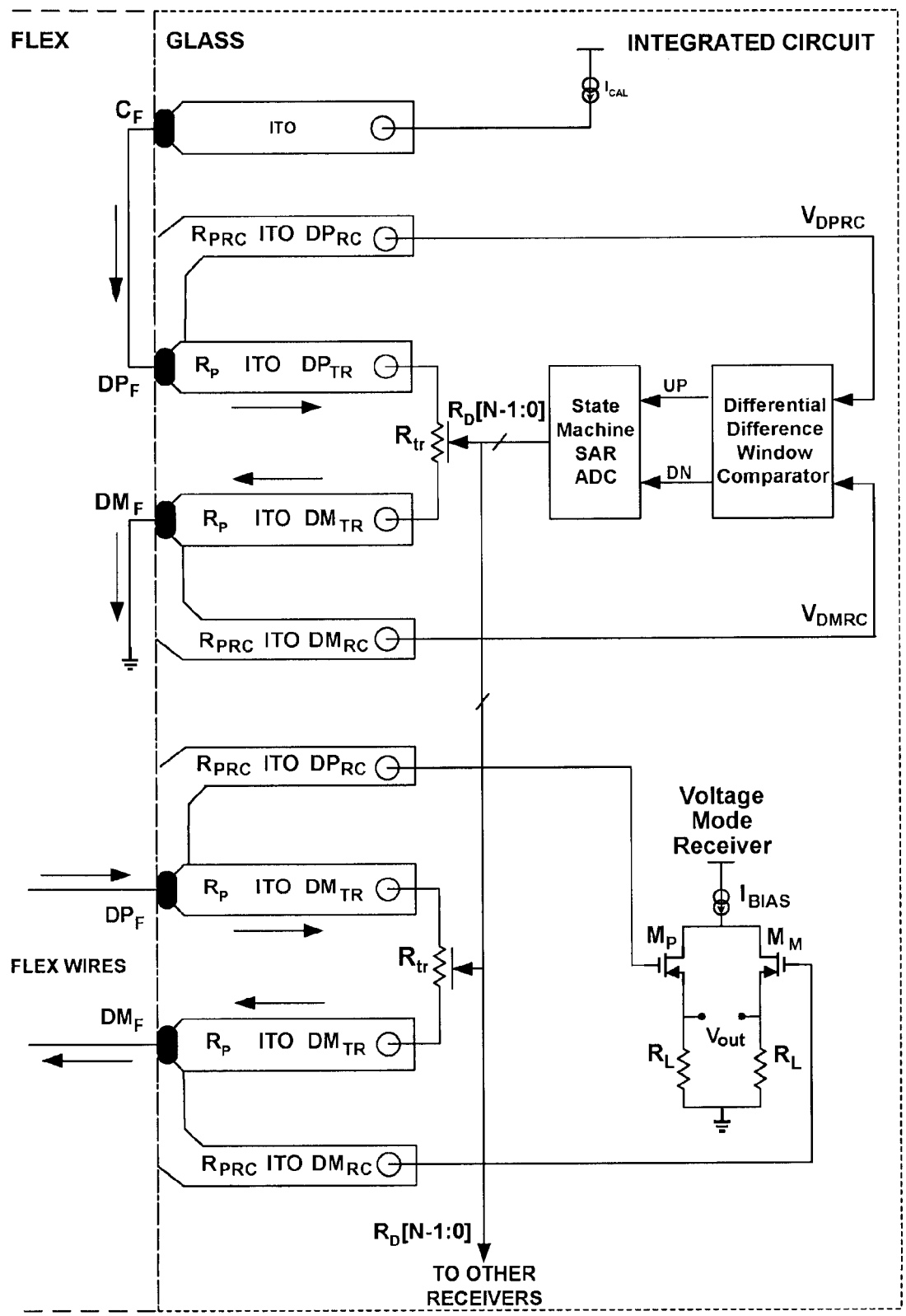
FIG. 12 illustrates the use of the termination compensation circuitry of FIG. 9 to compensate multiple differential signal terminations within an integrated circuit.

Referring to FIG. 12, an example is shown in which on-die termination resistances $R_{tr}$ of multiple differential channels can be controlled with a control signal (digital or analog) applied to the on-die termination resistors $R_{tr}$ as discussed above.

Figure 13:
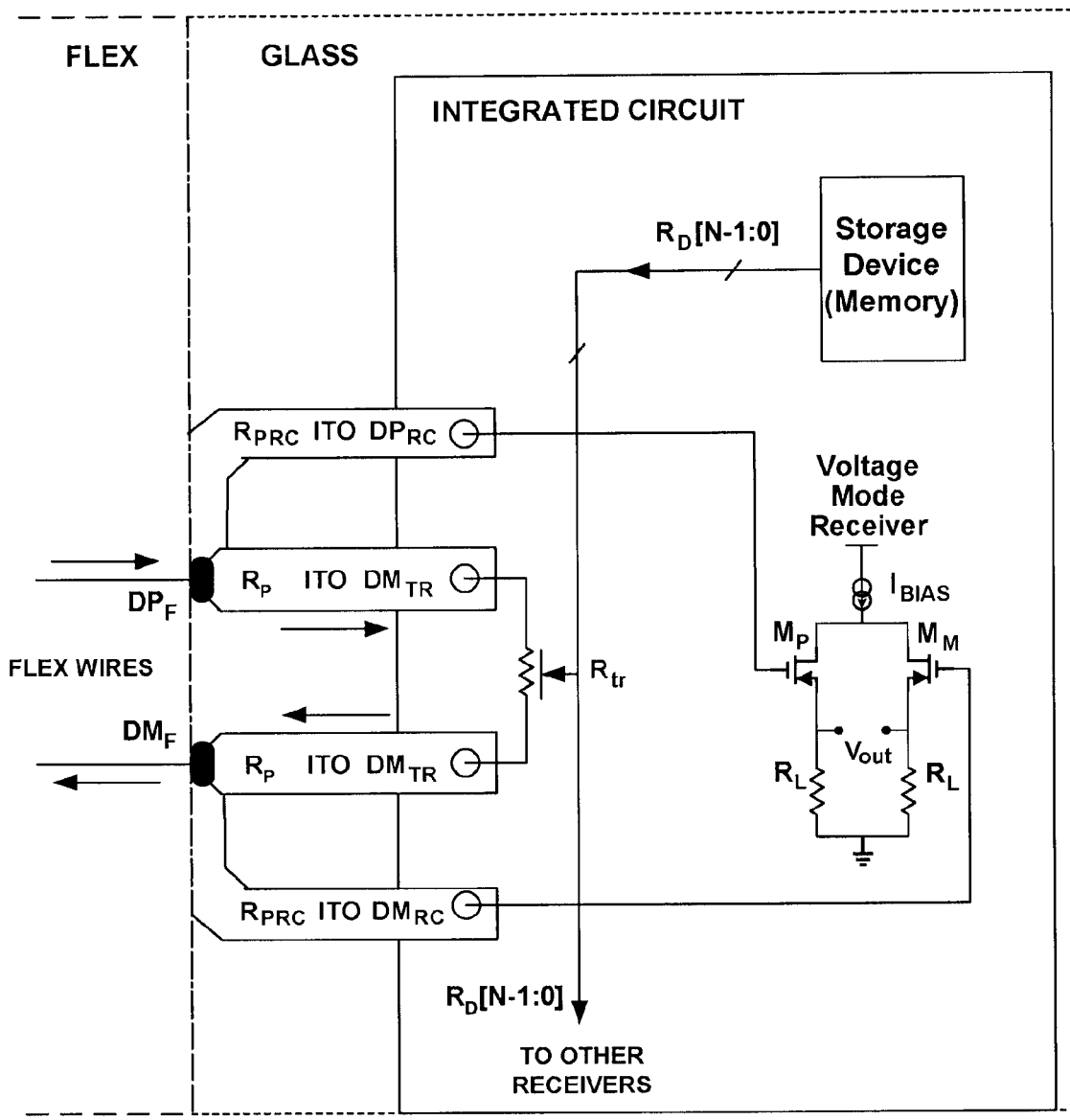
FIG. 13 illustrates an alternative embodiment of the termination compensation circuitry of FIG. 9.

Referring to FIG. 13, an alternative technique for controlling the on-die termination resistance in a digital manner includes using a digital storage element (volatile or nonvolatile), e.g., RAM, ROM or EEPROM, to provide the N-bit word for controlling the on-die termination resistances $R_{tr}$. Multiple values for the control data can be stored after they are received from the ADC circuitry (FIG. 8) or stored after they are received from another source (not shown) of digital control data, e.g., an off-chip storage element or programming circuit in which predetermined control data has been stored or generated. As a further alternative, the source of the control data can be off-chip with the N-bit control word received via one or more interface electrodes.

Based upon the foregoing discussion, it will be readily appreciated that while termination resistance control in accordance with the presently claimed invention requires additional electrodes for the display driver IC, additional ITO traces and some additional power for the compensation circuitry, the resulting benefits of controlled differential termination resistances for improved operation of the differential interface are significant. Further, termination resistance control in accordance with the presently claimed invention provides compensation for differences in display module designs when different LCD glass is used with the same display driver IC, thereby providing an additional benefit of interoperability and thus reducing costs of the final application. Accordingly, the presently claimed invention advantageously provides simple and reliable compensation for on-die termination for CMOS differential receivers for resistive losses in the ITO interconnects in COG applications. It will also be readily appreciated that while the foregoing discussion has been in the context of display drivers for LCD displays, the presently claimed invention can be used in other applications that use CMOS differential interfaces to communicate with integrated circuits bonded to a glass surface.

Various other modifications and alternations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a substrate with interface electrodes and integrated calibration and differential signal receiver circuitry mutually coupled via a plurality of conductors, comprising:

a substrate;

first and second calibration electrodes disposed on said substrate to convey a calibration current and a related calibration voltage;

first and second calibration conductors disposed on said substrate and coupled to said first and second interface electrodes to conduct said calibration current;

third and fourth calibration conductors disposed on said substrate and coupled to said first and second calibration electrodes to convey said calibration voltage;

a fifth calibration conductor disposed on said substrate and to be coupled to one of said first and second calibration electrodes and conduct said calibration current;

first and second signal electrodes disposed on said substrate to convey a differential signal having a signal voltage and a signal current;

first and second signal conductors disposed on said substrate and coupled to said first and second signal electrodes to conduct said signal current;

third and fourth signal conductors disposed on said substrate and coupled to said first and second signal electrodes to convey said signal voltage; and integrated calibration and differential signal receiver circuitry coupled to said first, second, third, fourth and fifth calibration conductors and said first, second, third and fourth signal conductors, and including current source circuitry to provide said calibration current, first conductive circuitry to conduct said calibration current and including a resistance having a magnitude related to one or more control signals, wherein said calibration voltage has a magnitude related to said conduction of said calibration current by said first and second calibration conductors and said first conductive circuitry resistance, control circuitry coupled to said first conductive circuitry to sense said calibration voltage and in response thereto provide said one or more control signals, second conductive circuitry to conduct said signal current and including a resistance having a magnitude related to at least one of said one or more control signals, wherein said signal voltage has a magnitude related to said conduction of said signal current by said first and second signal conductors and said second conductive circuitry, and amplifier circuitry to sense said signal voltage and in response thereto provide a corresponding output signal.

2. The apparatus of claim 1, wherein:
said first, second, third and fourth calibration conductors have first, second, third and fourth electrical resistances, respectively, which are substantially mutually equal; and said first, second, third and fourth signal conductors have fifth, sixth, seventh and eighth electrical resistances, respectively, which are substantially mutually equal.

3. The apparatus of claim 1, wherein:
said first, second, third, fourth and fifth calibration conductors comprise first, second, third, fourth and fifth conductive film traces, respectively; and said first, second, third and fourth signal conductors comprise sixth, seventh, eighth and ninth conductive film traces, respectively.

4. The apparatus of claim 1, wherein:
said first conductive circuitry comprises a first one or more transistors operated in a first resistive mode of operation; and said second conductive circuitry comprises a second one or more transistors operated in a second resistive mode of operation.

5. The apparatus of claim 1, wherein:
said first conductive circuitry comprises
a first plurality of resistances, and
first switching circuitry coupled to said first plurality of resistances and responsive to said one or more control signals such that one or more of said first plurality of resistances conduct respective portions of said calibration current; and said second conductive circuitry comprises
a second plurality of resistances, and
second switching circuitry coupled to said second plurality of resistances and responsive to said at least one of said one or more control signals such that one or more of said second plurality of resistances conduct respective portions of said signal current.

6. The apparatus of claim 1, wherein said control circuitry comprises:
signal comparison circuitry to compare said calibration voltage and one or more reference voltages and in response thereto provide one or more calibration signals; and signal conversion circuitry coupled to said signal comparison circuitry to convert said one or more calibration signals to said one or more control signals.

7. The apparatus of claim 1, wherein said amplifier circuitry comprises differential amplifier circuitry.

* * * * *